United States Patent
Wang et al.

(10) Patent No.: US 9,250,484 B2
(45) Date of Patent: Feb. 2, 2016

(54) ACTIVE DEVICE ARRAY SUBSTRATE

(71) Applicant: AU Optronics Corporation, Hsin-Chu (TW)

(72) Inventors: Cheng Wang, Hsin-Chu (TW);
Jen-Yang Chung, Hsin-Chu (TW);
Kun-Cheng Tien, Hsin-Chu (TW);
Wei-Chun Wei, Hsin-Chu (TW);
Shin-Mei Gong, Hsin-Chu (TW);
Ming-Huei Wu, Hsin-Chu (TW);
Chien-Huang Liao, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 14/313,212

(22) Filed: Jun. 24, 2014

(65) Prior Publication Data
US 2015/0160518 A1 Jun. 11, 2015

(30) Foreign Application Priority Data
Dec. 9, 2013 (TW) .............................. 102145153 A

(51) Int. Cl.
G02F 1/1343 (2006.01)
H01L 27/12 (2006.01)
G02F 1/1362 (2006.01)

(52) U.S. Cl.
CPC ...... *G02F 1/134309* (2013.01); *G02F 1/13624* (2013.01); *G02F 1/136286* (2013.01); *H01L 27/124* (2013.01)

(58) Field of Classification Search
CPC ..................... G02F 1/133707; G02F 1/134336; G02F 2201/40; G02F 1/136213
See application file for complete search history.

(56) References Cited

U.S. PATENT DOCUMENTS

| | | | |
|---|---|---|---|
| 7,304,691 B2 | 12/2007 | Song et al. | |
| 7,649,601 B2 | 1/2010 | Ikeda et al. | |
| 2003/0197819 A1* | 10/2003 | Sunohara | G02F 1/133707 349/113 |
| 2011/0141001 A1* | 6/2011 | Yoshida | G02F 1/134309 345/87 |
| 2011/0141423 A1* | 6/2011 | Cheng et al. | 349/141 |
| 2011/0309402 A1 | 12/2011 | Liu et al. | |
| 2012/0138963 A1* | 6/2012 | Tseng | G02F 1/134309 257/88 |
| 2012/0280236 A1* | 11/2012 | Kim | G02F 1/1362 257/59 |
| 2014/0042416 A1* | 2/2014 | Imai | H01L 27/307 257/40 |

* cited by examiner

*Primary Examiner* — Jae Lee
*Assistant Examiner* — Mohammed R Alam
(74) *Attorney, Agent, or Firm* — WPAT, PC; Justin King

(57) ABSTRACT

An active device array substrate includes a substrate, a first pixel electrode, and a first raised pattern. The first pixel electrode is disposed on or above the substrate, and the first pixel electrode includes a first truck electrode, a second truck electrode, and a plurality of first branch electrodes. The first truck electrode and the second truck electrode intersect to form a first node at the intersection of the first truck electrode and the second truck electrode. The first branch electrodes are connected to the first truck electrode and the second truck electrode to form a plurality of first domains, wherein the first branch electrodes are asymmetrical with respect to the second truck electrode. The first raised pattern is disposed at least between the first node and the substrate to form a first raised structure at least at the first node.

56 Claims, 9 Drawing Sheets

ACTIVE DEVICE ARRAY SUBSTRATE

This application claims priority to Taiwan Application Serial Number 102145153, filed Dec. 9, 2013, which is herein incorporated by reference.

BACKGROUND

1. Field of Technology

The present disclosure relates to an active device array substrate.

2. Description of Related Art

In multi-domain vertical alignment technology, liquid crystal molecules are aligned in various directions to reach multi-domain liquid crystal by the designs of pixel structures and electric field distributions, which further enhances the performance of wide viewing angle of optical devices. However, in some multi-domain vertical alignment mode displays, the nodes of liquid crystal molecules are difficult to fixed at the intersections of truck electrodes exactly, which causes the reorientation of the liquid crystal molecule unstable. The instability of the reorientation of liquid crystal affects the image quality seriously.

SUMMARY

One aspect of the present disclosure provides an active device array substrate for solving the above problems in related art.

According to one or more embodiments of the present disclosure, an active device array substrate includes a substrate, a scan line, a data line, an active device, a first pixel electrode, and a first raised pattern. The scan line is disposed on or above the substrate. The data line is disposed on or above the substrate. The active device electrically connects to the scan line and the data line. The first pixel electrode is disposed on or above the substrate and electrically connected to the active device. The first pixel electrode includes a first truck electrode, a second truck electrode, and plural first branch electrodes. The first truck electrode and the second truck electrode intersect and are electrically connected to the active device to form a first node at the intersection of the first truck electrode and the second truck electrode. The first branch electrodes are connected to the first truck electrode and the second truck electrode to form plural first domains, in which the first branch electrodes are asymmetrical with respect to the second truck electrode. The first raised pattern is disposed at least between the first node and the substrate to form a first raised structure at least at the first node.

According to one or more embodiments of the present disclosure, the first domains disposing on two opposite sides of the second truck electrode stated above have different sizes.

According to one or more embodiments of the present disclosure, the first truck electrode stated above is divided into a first segment and a second segment by the second truck electrode, and a length of the second segment is longer than a length of the first segment. The first raised pattern is disposed between the first segment and the substrate, and the first segment forms the first raised structure.

According to one or more embodiments of the present disclosure, the first raised pattern stated above is disposed between at least a portion of the second segment and the substrate, and the portion of the second segment forms the first raised structure.

According to one or more embodiments of the present disclosure, the second truck electrode stated above is divided into a first segment and a second segment by the first truck electrode, the first raised pattern is disposed between at least a portion of the first segment of the second truck electrode and the substrate and between at least a portion of the second segment of the second truck electrode and the substrate, and the portion of the first segment and the portion of the second segment of the second truck electrode form the first raised structure.

According to one or more embodiments of the present disclosure, the first raised pattern stated above is disposed between the whole second truck electrode and the substrate, and the whole second truck electrode forms the first raised structure.

According to one or more embodiments of the present disclosure, the first raised pattern stated above is disposed between the whole first segment and the substrate, and the whole first segment forms the first raised structure.

According to one or more embodiments of the present disclosure, the first raised pattern stated above is disposed between the whole second truck electrode and the substrate, and the whole second truck electrode forms the first raised structure.

According to one or more embodiments of the present disclosure, the second truck electrode stated above is divided into a first segment and a second segment by the first truck electrode. The first raised pattern is disposed between at least a portion of the first segment of the second truck electrode and the substrate and between at least a portion of the second segment of the second truck electrode and the substrate, and the portion of the first segment and the portion of the second segment of the second truck electrode form the first raised structure According to one or more embodiments of the present disclosure, the first pixel electrode stated above includes a third truck electrode and plural second branch electrodes. The third truck electrode intersects with the first truck electrode to form a second node at an intersection of the first truck electrode and the third truck electrode, in which the second truck electrode and the third truck electrode are parallel to each other and close to the two adjoining data lines respectively. The second branch electrodes are connected to the first truck electrode and the third truck electrode to define plural second domains, and the second domains disposing on two opposite sides of the third truck electrode have different sizes.

According to one or more embodiments of the present disclosure, the active device array substrate stated above includes a second raised pattern, and the second raised pattern is at least disposed between the second node and the substrate to form a second raised structure at least at the second node According to one or more embodiments of the present disclosure, the first truck electrode stated above is divided into a first segment and a second segment by the third truck electrode, a length of the second segment is longer than a length of the first segment. The second raised pattern is disposed between the first segment and the substrate, and the first segment forms the second raised structure.

According to one or more embodiments of the present disclosure, the second raised pattern stated above is disposed between at least a portion of the second segment and the substrate, and the portion of the second segment forms the second raised structure.

According to one or more embodiments of the present disclosure, the third truck electrode stated above is divided into a first segment and a second segment by the first truck electrode. The second raised pattern is disposed between at least a portion of the first segment of the third truck electrode and the substrate and between at least a portion of the second segment of the third truck electrode and the substrate, and the portion of the first segment and the portion of the second segment of the third truck electrode form the second raised structure.

According to one or more embodiments of the present disclosure, the second raised pattern stated above is disposed between the whole third truck electrode and the substrate, and the whole third truck electrode forms the second raised structure.

According to one or more embodiments of the present disclosure, the second raised pattern stated above is disposed between the whole first segment and the substrate, and the whole first segment forms the second raised structure.

According to one or more embodiments of the present disclosure, the second raised pattern stated above is disposed between the whole third truck electrode and the substrate, and the whole third truck electrode forms the second raised structure.

According to one or more embodiments of the present disclosure, the third truck electrode stated above is divided into a first segment and a second segment by the first truck electrode, the second raised pattern is disposed between at least a portion of the first segment of the third truck electrode and the substrate and between at least a portion of the second segment of the third truck electrode and the substrate, and the portion of the first segment and the portion of the second segment of the third truck electrode form the second raised structure.

According to one or more embodiments of the present disclosure, the active device array substrate stated above further includes a second pixel electrode and a keel electrode. The second pixel electrode is disposed on or above the substrate. The keel electrode is electrically connected to the second pixel electrode and the active device, in which plural projections of the first branch electrodes of the first pixel electrode on the substrate are not overlapped with a projection of the keel electrode on the substrate.

According to one or more embodiments of the present disclosure, the first truck electrode of the first pixel electrode stated above crosses the keel electrode.

According to one or more embodiments of the present disclosure, a shortest distance between the projections of the first branch electrodes and the projection of the keel electrode stated above on the substrate is larger than about 2 micrometers.

According to one or more embodiments of the present disclosure, the active device array substrate stated above further includes a second pixel electrode and a keel electrode. The second pixel electrode is disposed on or above the substrate. The keel electrode is electrically connected to the second pixel electrode and the active device, in which the first truck electrode is separated into a first sub-portion and a second sub-portion at the location of the keel electrode. Plural projections of the first sub-portion and the second sub-portion on the substrate are not overlapped with a projection of the keel electrode on the substrate.

According to one or more embodiments of the present disclosure, the first pixel electrode stated above includes a third truck electrode, second branch electrodes, and a bridge electrode. The third truck electrode intersects with the second sub-portion of the first truck electrode. The second truck electrode intersects with the first sub-portion of the first truck electrode. The second branch electrodes are connected to the second sub-portion of the first truck electrode and the third truck electrode. The first branch electrodes are connected to the first sub-portion of the first truck electrode and the second truck electrode. The bridge electrode crosses the keel electrode and connected to at least one of the first branch electrodes and at least one of the second branch electrodes.

According to one or more embodiments of the present disclosure, the second truck electrode and the third truck electrode of the first pixel electrode stated above are parallel to each other and close to the two adjoining data lines respectively, and plural projections of the second truck electrode and the third truck electrode on the substrate are not overlapped with a projection of the keel electrode on the substrate.

According to one or more embodiments of the present disclosure, a shortest distance between the projections of the first sub-portion and the keel electrode stated above on the substrate is larger than about 2 micrometers.

According to one or more embodiments of the present disclosure, a shortest distance between the projections of the second sub-portion and the keel electrode stated above on the substrate is larger than about 2 micrometers.

According to one or more embodiments of the present disclosure, the first truck electrode stated above is disposed on an edge of the first pixel electrode, the second truck electrode is disposed on an edge of the first pixel electrode, and first node is disposed at a corner of the first pixel electrode.

According to one or more embodiments of the present disclosure, the first raised pattern stated above is disposed between the whole first truck electrode and the substrate, and the whole first truck electrode forms the first raised structure.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The disclosure can be more fully understood by reading the following detailed description of the embodiment, with reference made to the accompanying drawings as follows.

DETAILED DESCRIPTION

Figure 1:
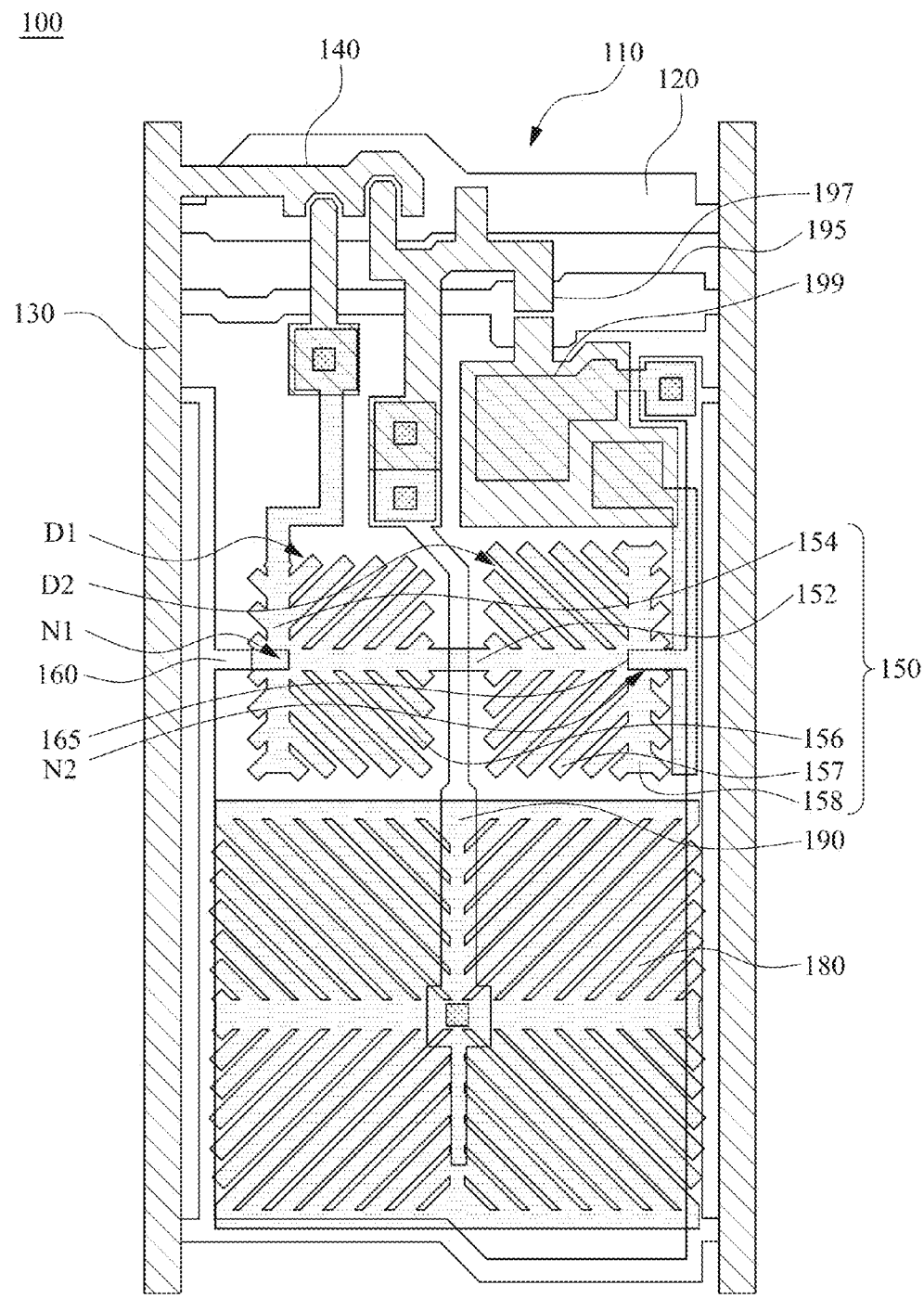
FIG. 1 is a partial top view of a single pixel of an active device array substrate according to a first embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

First Embodiment

Figure 2:
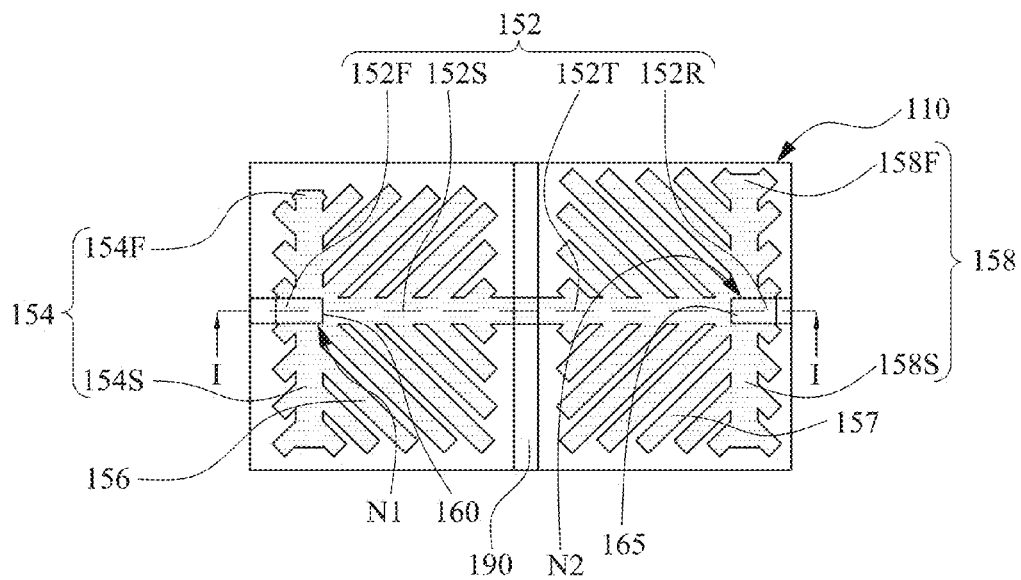
FIG. 2 is a partial top view of a first pixel electrode of FIG. 1.
Figure 3:
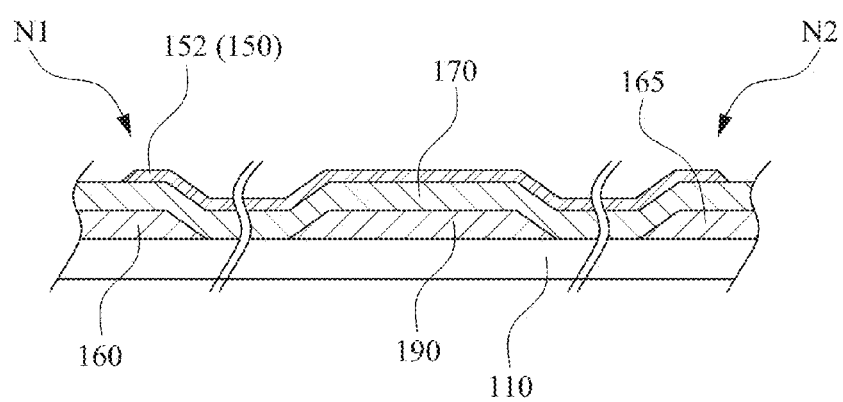
FIG. 3 is a cross-sectional view along line I of FIG. 2.

FIG. 1 is a partial top view of a single pixel of an active device array substrate 100 according to a first embodiment of the present disclosure. FIG. 2 is a partial top view of a first pixel electrode 150 of FIG. 1. FIG. 3 is a cross-sectional view along line I of FIG. 2. As shown in FIG. 1 to FIG. 3, an active device array substrate 100 includes a substrate 110, at least one scan line 120, at least one data line 130, an active device 140, a first pixel electrode 150, and a first raised pattern (or namely first raised film) 160, wherein the first raised pattern 160 can be referred to as a first bulged pattern, a first salient pattern, a first protruded pattern. The scan line 120 is disposed on or above the substrate 110. The data line 130 is disposed on or above the substrate 110. The scan line 120 and the data line 130 are interlaced (or namely intersected) with each other. The active device 140 electrically connects to the scan line 120 and the data line 130. The first pixel electrode 150 is disposed on or above the substrate 110 and electrically connected to the active device 140. The first pixel electrode 150 includes a first truck electrode 152, a second truck electrode 154, and plural first branch electrodes 156. The second truck electrode 154 is disposed in a vertical direction (such as a long direction), wherein the long direction is parallel with the data line 130, for being electrically connected to the first pixel electrode 150 and the active device 140. In other embodiment, the long direction is parallel with the scan line 120, so that the long direction is parallel with either the data line 130 or the scan line 120. The first truck electrode 152 and the second truck electrode 154 intersect to form a first node N1 at an intersection of the first truck electrode 152 and the second truck electrode 154. The first branch electrodes 156 are connected to the first truck electrode 152 and the second truck electrode 154 to define plural first domains D1, in which the first branch electrodes 156 are at least asymmetrical with respect to the second truck electrode 154. The first raised pattern 160 is disposed at least between the first node N1 and the substrate 110 to form a first raised structure (or namely a first bulged structure, a first protruded structure, or a first salient structure) at least at the first node N1.

The first raised structure stated above should be explained as "a portion with a larger height from the substrate 110 than that of other surrounding portions." Since the existence of the first raised structure, the equipotential lines of the electric field formed by the first pixel electrode 150 are raised following the first raised structure. For the liquid crystal molecules with the same height from the substrate 110, the closer the distance between the liquid crystal molecules and the first raised structure, the stronger the electric fields, and the higher the degrees of the reorientations of the liquid crystal molecules. Therefore, this kind of electric field distribution forces the liquid crystal molecules to lie down toward the first raised structure, so the node of the liquid crystals can be fixed exactly at the intersection of the first truck electrode 152 and the second truck electrode 154 (i.e. the first node N1). Also, the reorientations of liquid crystal can be stabilized, and the image quality is improved In addition, under certain circumstances, if the first branch electrodes 156 are symmetrical with respect to the second truck electrode 154, there can be some alignment problems of liquid crystal molecules on the borders of the first domain D1. As a result, in this embodiment, the first branch electrodes 156 are asymmetrical with respect to the second truck electrode 154, so that the sizes of the first domains D1 on the opposite sides of the second truck electrode 154 are different, and the alignment of the liquid crystal molecule is better.

As shown in FIG. 2, the first truck electrode 152 includes a first portion 152F, a second portion 152S, a third portion 152T, and a fourth portion 152R. Moreover, the first truck electrode 152 is divided into a first segment (i.e. the first portion 152F) and a second segment (i.e. the second portion 152S, the third portion 152T, and the fourth portion 152R) by the second truck electrode 154. A length of the second segment (i.e. the second portion 152S, the third portion 152T, and the fourth portion 152R) is longer than a length of the first segment (i.e. the first portion 152F). The first raised pattern 160 is disposed between the first segment and the substrate 110, so that the first segment forms the first raised structure. In this embodiment, the above-mentioned first raised pattern 160 is disposed between the whole first segment (i.e. the first portion 152F) and substrate 110, so that the whole first segment (i.e. the first portion 152F) forms the first raised structure.

The above-mentioned first raised pattern 160 can be a part of a first metal layer or a part of a second metal layer of the active device array substrate, or the above-mentioned first raised pattern 160 can be a stacked layer including the part of the first metal layer and the part of the second metal layer of the active device array substrate. More specifically, the above-mentioned first raised pattern 160 can belong to the same patterning metal layer as the scan line 120 or data line 130 does or the above-mentioned stacked layer. In this embodiment, the scan line 120 and the above-mentioned first raised pattern 160 belong to the same patterning metal layer. In addition, in the actual operation, the above-mentioned first raised pattern 160 can be electrically connected to a common potential source, so that the reorientations of liquid crystal molecules are prevented from being influences by the electric fields produced by the first raised pattern 160. It should be understood that the materials and operations of the first raised pattern 160 are simply used as examples, and these details of practice do not intend to limit the present disclosure. The materials of the first raised pattern 160 can also be transparent conductive materials or insulation materials. For one of ordinary skill in the art, it is flexible to choose the materials and operations of the first raised pattern 160 depending on the actual situations.

As shown in FIG. 3, when the first raised pattern 160 is electrically connected to a common potential source, there can be an insulating layer 170 between the first raised pattern 160 and the first pixel electrode 150.

Reference is now made back to FIG. 1 to FIG. 3. In this embodiment, the first pixel electrode 150 includes a third truck electrode 158 and plural second branch electrodes 157. The third truck electrode 158 is also disposed in a vertical direction. For example, the third truck electrode 158 is parallel with the long direction, such as data line 130. The third truck electrode 158 and the second truck electrode 154 are disposed on the opposite sides of the first pixel electrode 150 respectively and close to two adjoining data lines 130 respectively. The third truck electrode 158 and the first truck electrode 152 intersect to form a second node N2 at the intersection of the third truck electrode 158 and the first truck electrode 152. The second branch electrodes 157 are connected to the first truck electrode 152 and the third truck electrode 158 to define plural second domains D2, in which the areas of the second domains D2 on the opposite sides of the third truck electrode 158 are different. Moreover, the active device array substrate 100 according to this embodiment of the present disclosure further includes a second raised pattern (or namely a second raised film) 165, wherein the second raised pattern can be referred to as a second bulged pattern, a second salient pattern, or a second protruded pattern. The second raised pattern 165 is at least disposed between the second node N2 and the substrate 110 to form a second raised structure (or namely a second bulged structure, a second protruded structure, or a second salient structure) at least at the second node N2.

Similarly, the above-mentioned second raised structure should be explained as "a portion with a larger height from the substrate 110 than that of other surrounding portions." Since the existence of the second raised structure, the equipotential lines of the electric field formed by the first pixel electrode 150 are raised following the second raised structure. For the liquid crystal molecules with the same height from the substrate 110, the closer the distance between the liquid crystal molecules and the second raised structure, the stronger the electric fields, and the higher the degrees of the reorientations of the liquid crystal molecules. Therefore, this kind of electric field distribution forces the liquid crystal molecules to lie down toward the second raised structure, so the node of the liquid crystals can be fixed exactly at the intersection of the first truck electrode 152 and the third truck electrode 158 (i.e. the second node N2). Also, the orientations of liquid crystal can be stabilized, and the image quality is improved In addition, under certain circumstances, if the second branch electrodes 157 are symmetrical with respect to the third truck electrode 158, there may be some alignment problems of liquid crystal molecules on the borders of the second domain D2. As a result, in this embodiment, the second branch electrodes 157 can be asymmetrical with respect to the third truck electrode 158, so that the sizes of the second domains D2 on the opposite sides of the third truck electrode 158 are different, and the alignment of the liquid crystal molecule is better.

As shown in FIG. 2, the first truck electrode 152 is divided into a first segment (i.e. the fourth portion 152R) and a second segment (i.e. the first portion 152F, the second portion 152S, and the third portion 152T) by the third truck electrode 158. The second raised pattern 165 is disposed between at least a portion of the first segment (i.e. the fourth portion 152R) and the substrate 110, so that the portion of first segment (i.e. the fourth portion 152R) forms the second raised structure. In this embodiment, the above-mentioned first raised pattern is disposed between the whole first segment (i.e. the fourth portion 152R) and substrate 110, so that the whole first segment (i.e. the fourth portion 152R) forms the second raised structure.

The above-mentioned second raised pattern 165 can be a part of the first metal layer or a part of the second metal layer of the active device array substrate. More specifically, the above-mentioned second raised pattern 165 belongs to the same patterning metal layer as the scan line 120 or data line 130 does, or the above-mentioned second raised pattern 165 belongs to a stacked layer including the part of the first metal layer and the part of the second metal layer of the active device array substrate. In this embodiment, the first raised pattern 160 and the above-mentioned second raised pattern 165 belong to the same patterning metal layer. In addition, in the actual operation, the above-mentioned second raised pattern 165 can be electrically connected to a common potential source, so that the reorientations of liquid crystal molecules are prevented from being influenced by the electric fields produced by the second raised pattern 165. It should be understood that the materials and operations of the second raised pattern 165 are simply used as examples, and these details of practice do not intend to limit the present disclosure. The materials of the second raised pattern 165 can also be transparent conductive materials or insulation materials. For one of ordinary skill in the art, it is flexible to choose the materials and operations of the second raised pattern 165 depending on the actual situations. As shown in FIG. 3, when the second raised pattern 165 is electrically connected to a common potential source, the above-mentioned insulating layer 170 can be disposed between the second raised pattern 165 and the first pixel electrode 150.

Reference is now made back to FIG. 1 and FIG. 2. In this embodiment, the active device array substrate can further include a second pixel electrode 180 and a keel electrode 190. The second pixel electrode 180 is disposed on or above the substrate 110. The keel electrode 190 is electrically connected to the second pixel electrode 180 and the active device 140. In this embodiment, the keel electrode 190 is formed by the first metal layer and connected to the active device 140 by the bridging of the conductive layer thereon. However, these details of practice do not limit the scope of the present disclosure, the keel electrode 190 can be formed by the second metal layer, that is, the keel electrode 190 can be directly formed by the extension of the source/drain electrode of the active device 140.

Under some circumstances, if the keel electrode 190 is overlapped with the first pixel electrode 150, a parasitic capacitor can be formed at the overlapping of the keel electrode 190 and the first pixel electrode 150, and the electrical charges can be accumulated herein. To deal with the circumstances, the first branch electrode 156 and/or the second branch electrode 157 of the first pixel electrode 150 of this embodiment are designed to retreat and not to be overlapped with the keel electrode 190. In other words, the projections of the first branch electrode 156 and/or the second branch electrode 157 on the substrate 110 are not overlapped with a projection of the keel electrode 190 on the substrate 110. If the keel electrode 190 is merely crossover the first truck electrode 152, the keel electrode 190 is not overlapped with the first branch electrode 156 and/or the second branch electrode 157 of the first pixel electrode 150, and the first and second raised patterns 160 and 165 do not exist in the pixel, a bad alignment direction of liquid crystal molecules will be produced to resulting in bright areas darker and node displacement.

In this embodiment, the shortest distance between the projections of the first branch electrode 156 and/or the second branch electrode 157 and the keel electrode 190 on the substrate 110 is larger than about 2 micrometers. It should be understood that the range of the shortest distance is merely used for illustration, and should not limit the scope of the present disclosure. For one of ordinary skill in the art, it is flexible to decide the shortest distance between the projections of the first branch electrode 156 and/or the second branch electrode 157 and the keel electrode 190 on the substrate 110 depending on the actual situations.

In addition, in this embodiment, the second truck electrode 154 and/or the third truck electrode 158 are designed to retreat and not to be overlapped with the keel electrode 190. That is, the projections of the second truck electrode 154 and/or the third truck electrode 158 on the substrate 110 are not overlapped with the projections of the keel electrode 190.

For maintaining the electrical connection of the first pixel electrode 150, in this embodiment, the first truck electrode 152 is disposed across the keel electrode 190. However, for the first pixel electrode 150 of this embodiment, only the position of the first truck electrode 152 that crosses the keel electrode 190 is overlapped with the keel electrode 190. Therefore, the influence of the parasitic capacitance therebetween can be reduced effectively.

Reference is now made back to FIG. 1. In this embodiment, the active device array substrate 100 can further include a sharing gate line 195, a sharing active device 197, and a storage capacitance 199. A gate electrode of the sharing active device 197 is electrically connected to the sharing gate line 195. A source electrode of the sharing active device 197 is electrically connected to the keel electrode 190. A drain electrode of the sharing active device 197 is electrically connected to the storage capacitance 199. In the operation, the scan line 120 opens the active device 140 at the Nth timing, and the data line 130 charges the first pixel electrode 150 and the second pixel electrode 180 to the potential of the data line. At the (N+1)th timing, the sharing gate line 195 opens the sharing active device 197, so that the potential of the second pixel electrode 180 is drawn to a lower potential, and the first pixel electrode 150 has a different potential from the second pixel electrode 180 does, which improves the problems of color washout.

Figure 4:
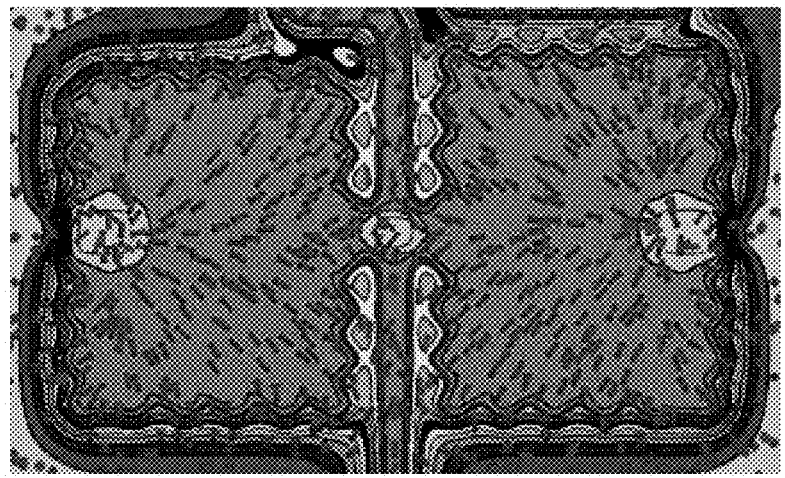
FIG. 4 is a simulation result of liquid crystal orientations of the active device array substrate according to the first embodiment.
Figure 5:
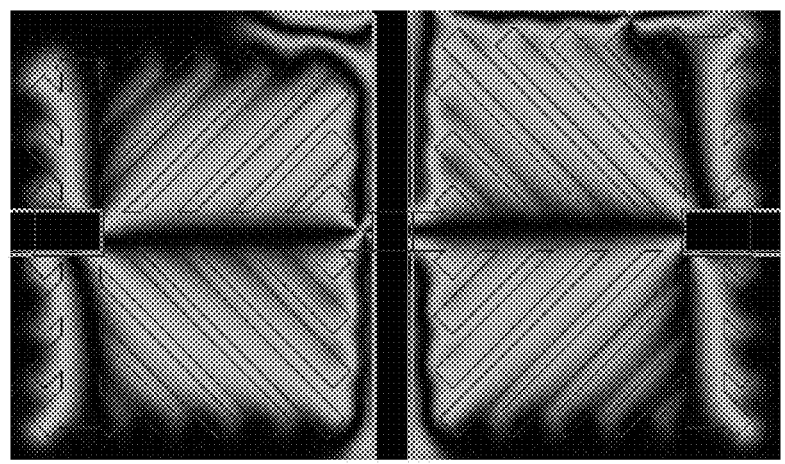
FIG. 5 is an image simulation result of an optical microscope of the active device array substrate according to the first embodiment.

FIG. 4 is a simulation result of liquid crystal orientations of the active device array substrate according to the first embodiment. FIG. 5 is an image simulation result of optical microscope of the active device array substrate according to the first embodiment. As shown in FIG. 4 and FIG. 5, the active device array substrate having the raising patterns can fix the node of liquid crystal molecules at the intersection of the truck electrodes indeed.

Second Embodiment

Figure 6:
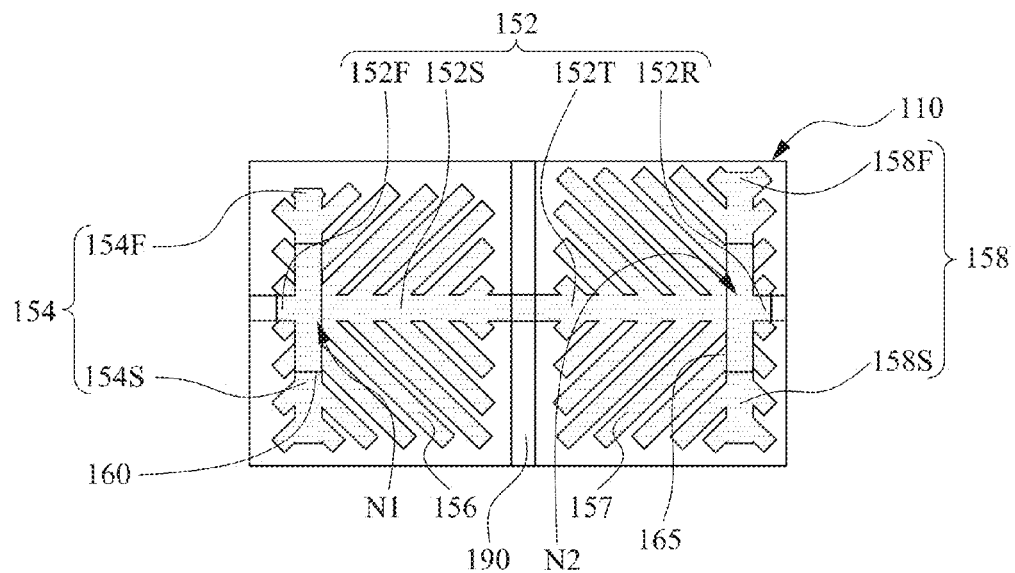
FIG. 6 is a partial top view of a first pixel electrode according to a second embodiment of the present disclosure.

FIG. 6 is a partial top view of a first pixel electrode according to a second embodiment of the present disclosure. The difference between this embodiment and the first embodiment is that the second truck electrode 154 of this embodiment is divided into a first segment 154F and a second segment 154S by the first truck electrode 152, and the first raised pattern 160 is disposed between at least a portion of the first segment 154F and the substrate 110, so that the portion of the first segment 154F forms the first raised structure. In addition, the first raised pattern 160 is also disposed between at least a portion of the second segment 154S and the substrate 110, so that the portion of the second segment 154S forms the first raised structure. In other words, the first raised pattern 160 includes a horizontal part and a vertical part, and the vertical part is connected to the horizontal part to form a substantially T-shape, so that the shape of the first raised structure projected in a plane is substantially T-shaped.

Similarly, the third truck electrode 158 is divided into a first segment 158F and a second segment 158S by the first truck electrode 152. Also, the second raised pattern 165 is disposed between at least a portion of the first segment 158F and the substrate 110, so that the portion of the first segment 158F forms the second raised structure. In addition, the second raised pattern 165 is also disposed between at least a portion of the second segment 158S and the substrate 110, so that the portion of the second segment 158S forms the second raised structure. In other words, the second raised pattern 165 includes a horizontal part and a vertical part, and the vertical part is connected to the horizontal part to form a substantially T-shape, so that the shape of the second raised structure projected in a plane is substantially T-shaped. The other related details of structures or materials are the same as shown in the first embodiment and thus not repeated herein.

Figure 7:
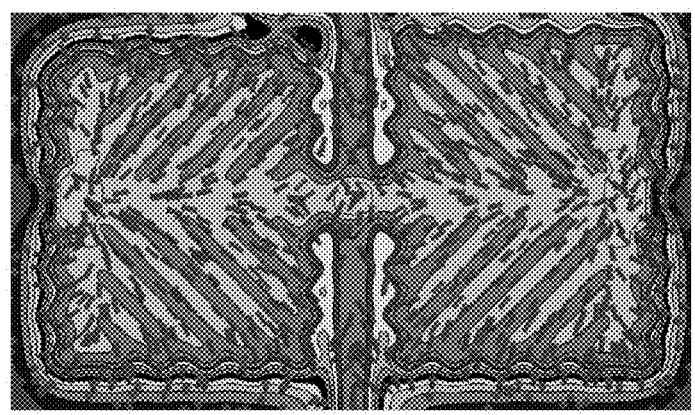
FIG. 7 is a simulation result of liquid crystal orientations of the active device array substrate according to the second embodiment.
Figure 8:
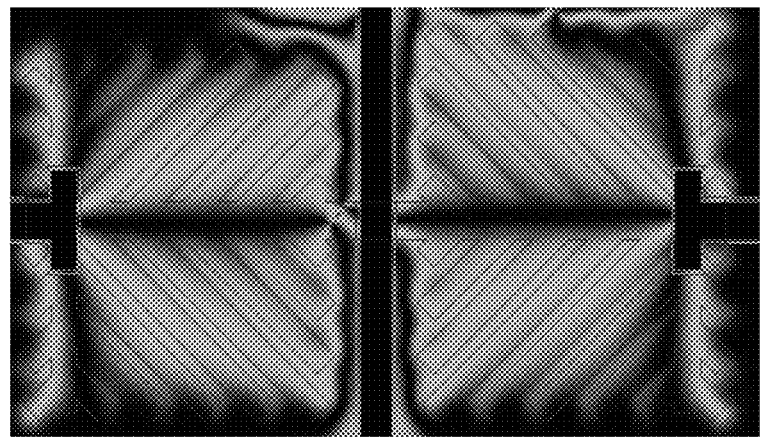
FIG. 8 is an image simulation result of an optical microscope of the active device array substrate according to the second embodiment.

FIG. 7 is a simulation result of liquid crystal orientations of the active device array substrate according to the second embodiment. FIG. 8 is an image simulation result of optical microscope of the active device array substrate according to the second embodiment. As shown in FIG. 7 and FIG. 8, the active device array substrate having the raising patterns can fix the node of liquid crystal molecules at the intersection of the truck electrodes indeed.

Third Embodiment

Figure 9:
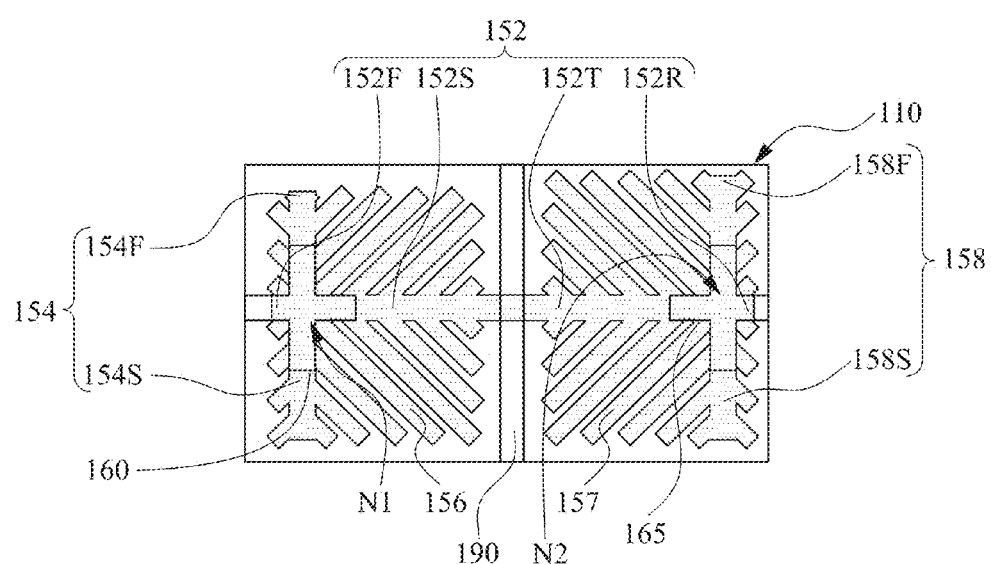
FIG. 9 is a partial top view of a first pixel electrode according to a third embodiment of the present disclosure.

FIG. 9 is a partial top view of a first pixel electrode according to a third embodiment of the present disclosure. The difference between this embodiment and the second embodiment is that the first raised pattern 160 of this embodiment is disposed between at least a portion of the second portion 152S and substrate 110. In other words, the first raised pattern 160 includes a horizontal part and a vertical part, and the vertical part is connected to and crossover the horizontal part to form a substantially crisscross-shape, so that the shape of the first raised structure projected in a plane is substantially crisscross-shaped. Thus, the second portion 152S also forms the first raised structure. In addition, the second raised pattern 165 is disposed between at least a portion of the third portion 152T and substrate 110. Thus, the portion of the third portion 152T also forms a second raised structure. In other words, the second raised pattern 165 includes a horizontal part and a vertical part, and the vertical part is connected to and crossover the horizontal part to form a substantially crisscross-shape, so that the shape of the second raised structure projected in a plane is substantially crisscross-shaped. The other related details of structures or materials are the same as shown in the second embodiment and thus not repeated herein.

Fourth Embodiment

Figure 10:
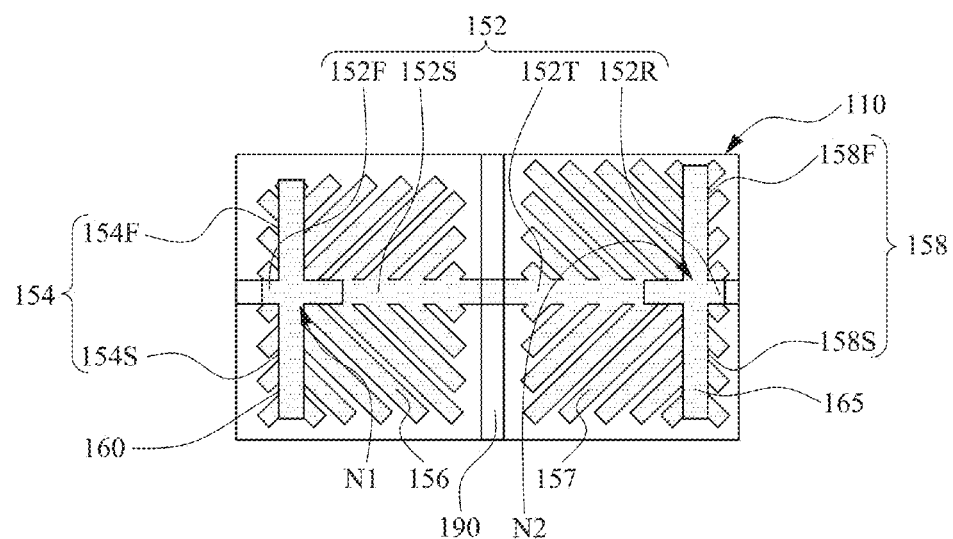
FIG. 10 is a partial top view of a first pixel electrode according to a fourth embodiment of the present disclosure.

FIG. 10 is a partial top view of a first pixel electrode according to a fourth embodiment of the present disclosure. The difference between this embodiment and the third embodiment is that the first raised pattern 160 of this embodiment is disposed between the whole first segment 154F and substrate 110. Thus, the whole first segment 154 forms the first raised structure. In addition, the first raised pattern 160 is also disposed between the whole second segment 154S and substrate 110. Thus, the whole second segment 154S forms the first raised structure. In other words, the first raised pattern 160 includes a horizontal part and a vertical part, the vertical part is connected to and crossover the horizontal part to form a substantially crisscross-shape, so that the shape of the first raised structure projected in a plane is substantially crisscross-shaped, wherein the length of the vertical part is larger than the length of the horizontal part.

In the same way, the second raise pattern 165 is disposed between the whole first segment 158F and the substrate 110, so that the whole first segment 158F forms the second raised structure. In addition, the second raise pattern 165 is also disposed between the whole second segment 158S and the substrate 110, so that the whole second segment 158S forms the second raised structure. In other words, the second raised pattern 165 includes a horizontal part and a vertical part, and the vertical part is connected to and crossover the horizontal part to form a substantially crisscross-shape, so that the shape of the second raised structure projected in a plane is substantially crisscross-shaped, wherein the length of the vertical part is larger than the length of the horizontal part. The other related details of structures or materials are the same as shown in the third embodiment and thus not repeated herein.

Figure 11:
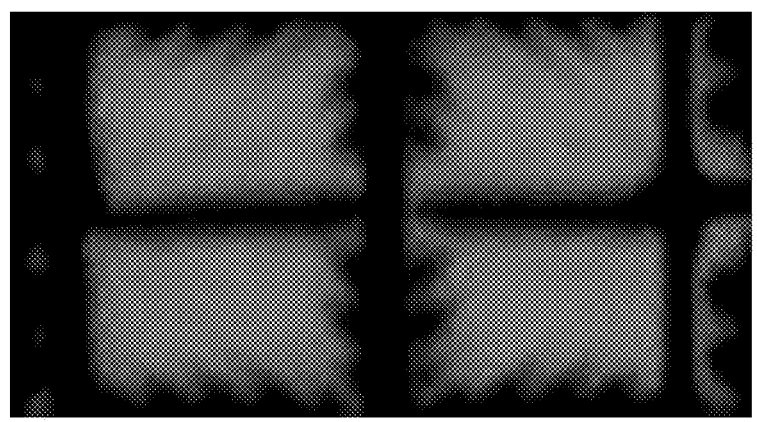
FIG. 11 is an actual image of the pixels of the active device array substrate according to the fourth embodiment of the present disclosure.

FIG. 11 is an actual image of the pixels of the active device array substrate according to the fourth embodiment of the present disclosure. As shown in FIG. 11, the active device array substrate having the raising patterns can fix the node of liquid crystal molecules at the intersection of the truck electrodes indeed, and the brightness of bright areas is uniform.

Fifth Embodiment

Figure 12:
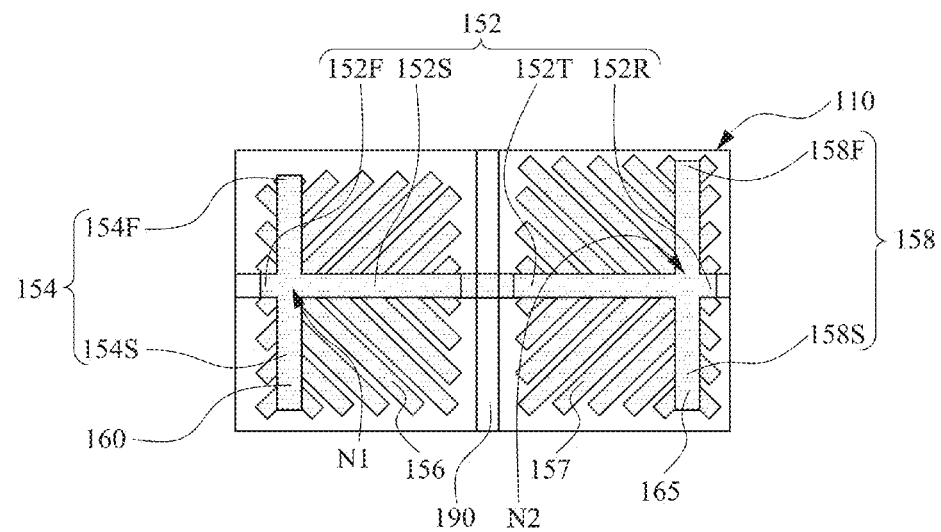
FIG. 12 is a partial top view of a first pixel electrode according to a fifth embodiment of the present disclosure.

FIG. 12 is a partial top view of a first pixel electrode according to a fifth embodiment of the present disclosure. The difference between this embodiment and the fourth embodiment is that the first raised pattern 160 of this embodiment is disposed between the almost whole second segment 152S and substrate 110, except that a predetermined gap is maintained between the first raised pattern 160 and the keel electrode 190, so that the almost whole second segment 152S forms the first raised structure. In other words, the first raised pattern 160 includes a horizontal part and a vertical part, and the vertical part is connected to and crossover the horizontal part to form a substantially crisscross-shape, so that the shape of the first raised structure projected in a plane is substantially crisscross-shaped. In addition, the second raised pattern 165 of this embodiment is disposed between the almost whole third portion 152T and substrate 110, except that a predetermined gap is maintained between the second raised pattern 165 and the keel electrode 190, so that the almost whole third portion 152T forms the second raised structure. In other words, the second raised pattern 165 includes a horizontal part and a vertical part, and the vertical part is connected to and crossover the horizontal part to form a substantially crisscross-shape, so that the shape of the second raised structure projected in a plane is substantially crisscross-shaped. The predetermined gap between the first raised pattern 160 and/or the second raised pattern 165 and the keel electrode 190 is larger than about 5 micrometers. The other related details of structures or materials are the same as shown in the fourth embodiment and thus not repeated herein.

Figure 13:
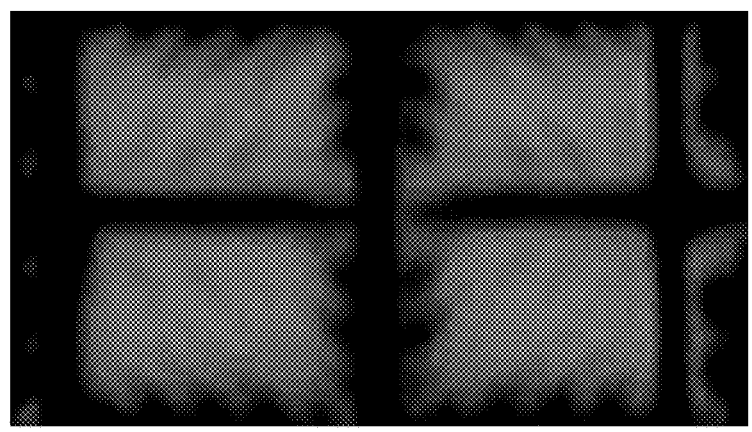
FIG. 13 is an actual image of the pixels of the active device array substrate according to the fifth embodiment of the present disclosure.

FIG. 13 is an actual image of the pixels of the active device array substrate according to the fifth embodiment of the present disclosure. As shown in FIG. 13, the active device array substrate having the raising patterns can fix the node of liquid crystal molecules at the intersection of the truck electrodes indeed, and the brightness of bright areas is uniform.

Sixth Embodiment

Figure 14:
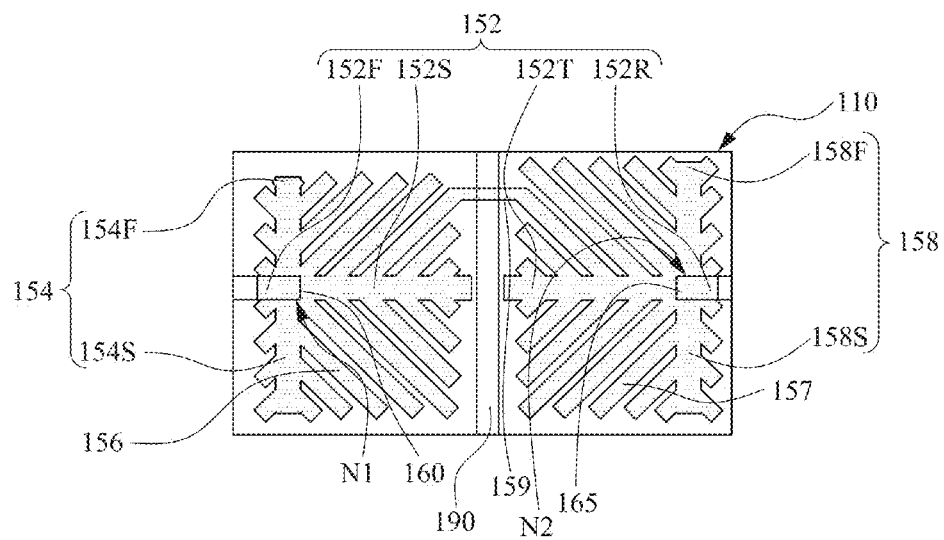
FIG. 14 is a partial top view of a first pixel electrode according to a sixth embodiment of the present disclosure.

FIG. 14 is a partial top view of a first pixel electrode according to a sixth embodiment of the present disclosure. The difference between this embodiment and the first embodiment is that the first truck electrode 152 of this embodiment is separated into a first sub-portion (i.e. the first portion 152F and the second portion 152S) and a second sub-portion (i.e. the third portion 152T and the fourth portion 152R) at the location of the keel electrode 190. Plural projections of the first sub-portion (i.e. the first portion 152F and the second portion 152S) and the second sub-portion (i.e. the third portion 152T and the fourth portion 152R) on the substrate 110 are not overlapped with a projection of the keel electrode 190 on the substrate.

In this embodiment, a shortest distance between the projections of the first sub-portion (i.e. the first portion 152F and the second portion 152S) and/or the second sub-portion (i.e. the third portion 152T and the fourth portion 152R) and the keel electrode 190 on the substrate 110 is larger than about 2 micrometers. It should be understood that the range of the shortest distance stated above is merely used for illustration, and it should not be used to limit the scope of the present disclosure. For one of ordinary skill in the art, it is flexible to choose the shortest distance between the projections of the first sub-portion (i.e. the first portion 152F and the second portion 152S) and/or the second sub-portion (i.e. the third portion 152T and the fourth portion 152R) and the keel electrode 190 on the substrate 110 depending on the actual situations.

For maintaining the electrical connection of the first pixel electrode, in this embodiment, the first pixel electrode includes a bridge electrode 159. The bridge electrode 159 crosses the keel electrode 190, one end of the bridge electrode 159 is connected to at least one of the first branch electrodes 156, and another end of the bridge electrode 159 is connected to at least one of the second branch electrodes 157. However, for the first pixel electrode of this embodiment, only the position of the bridge electrode 159 that crosses the keel electrode 190 is overlapped with the keel electrode 190. In other embodiments, the designs of the present embodiment can be used in the above-mentioned embodiments. Therefore, the influence of the parasitic capacitance therebetween can be reduced effectively. The other related details of structures or materials are the same as shown in the first embodiment and thus not repeated herein.

Seventh Embodiment

Figure 15:
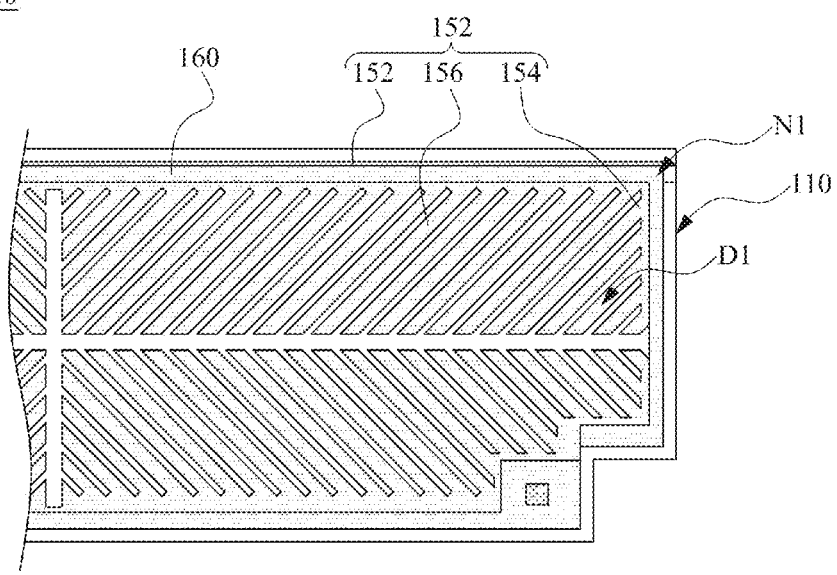
FIG. 15 is a partial top view of a first pixel electrode according to a seventh embodiment of the present disclosure.

FIG. 15 is a partial top view of a first pixel electrode according to a seventh embodiment of the present disclosure. The difference between this embodiment and the first embodiment is that the first truck electrode 152 and the second truck electrode 154 of this embodiment are both disposed on edges of the first pixel electrode. As a result, the intersection (i.e. the first node) of the first truck electrode 152 and the second truck electrode 154 is disposed at a corner of the first pixel electrode. In addition, the first raised pattern 160 of this embodiment is disposed between the whole first truck electrode 152 and/or the second truck electrode 154 and the substrate 110, so that the whole first truck electrode 152 and/or the second truck electrode 154 forms the first raised structure.

Figure 16:
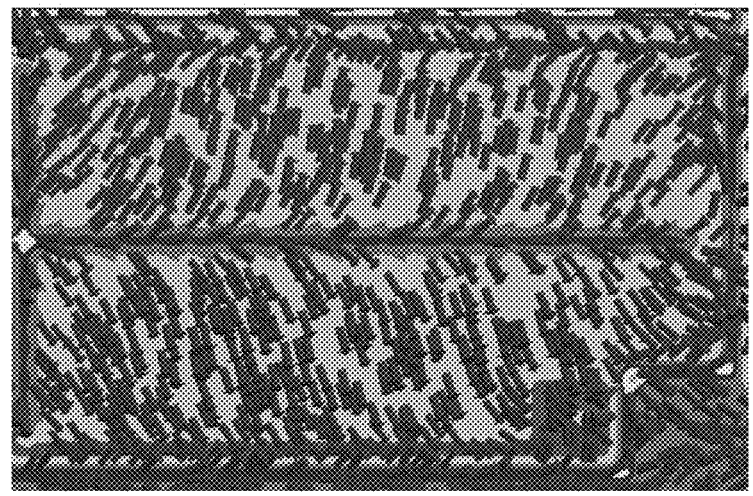
FIG. 16 is a simulation result of liquid crystal orientations of the active device array substrate according to the seventh embodiment.
Figure 17:
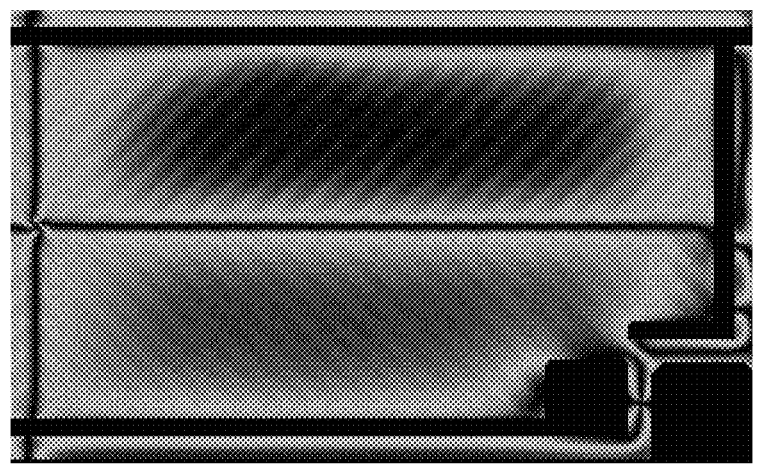
FIG. 17 is a simulation result of optical microscope images of the active device array substrate according to the seventh embodiment.

FIG. 16 is a simulation result of liquid crystal orientations of the active device array substrate according to the seventh embodiment. FIG. 17 is a simulation result of optical microscope images of the active device array substrate according to the seventh embodiment. As shown in FIG. 16 and FIG. 17, the active device array substrate having the raising patterns can exactly force the liquid crystal molecule to be reoriented by the electric field to lie down toward the truck electrodes.

Therefore, the node of liquid crystal molecules can be fixed at the cross-center of the first pixel electrode, and the middle dark area becomes smaller apparently, which enhances the aperture ratio.

What is claimed is:

1. An active device array substrate comprising:
   a substrate;
   at least one scan line, disposed on or above the substrate;
   at least one data line, disposed on or above the substrate;
   at least one active device, electrically connecting to the scan line and the data line;
   at least one first pixel electrode, disposed on the substrate and electrically connected to the active device, wherein the first pixel electrode comprises:
      at least one first truck electrode;
      at least one second truck electrode, intersecting with the first truck electrode and connected to the active device to form a first node at an intersection of the first truck electrode and the second truck electrode; and
      a plurality of first branch electrodes, connected to the first truck electrode and the second truck electrode to define a plurality of first domains, wherein a horizontal distance of at least one of the plurality of first branch electrodes protruding from one side of the second truck electrode is larger than a horizontal distance of a corresponding one of the plurality of the first branch electrodes protruding from another side of the second truck electrode; and
   at least one first raised pattern, disposed at least between the first node and the substrate to form a first raised structure at least at the first node.

2. The active device array substrate of claim 1, wherein the first domains disposing on two opposite sides of the second truck electrode have different areas.

3. The active device array substrate of claim 1, wherein the first truck electrode is divided into a first segment and a second segment by the second truck electrode, a length of the second segment is longer than a length of the first segment, the first raised pattern is disposed between the first segment and the substrate, and the first segment forms the first raised structure.

4. The active device array substrate of claim 3, wherein the first raised pattern is disposed between at least a portion of the second segment and the substrate, and the portion of the second segment forms the first raised structure.

5. The active device array substrate of claim 4, wherein the second truck electrode is divided into a first segment and a second segment by the first truck electrode, the first raised pattern is disposed between at least a portion of the first segment of the second truck electrode and the substrate and between at least a portion of the second segment of the second truck electrode and the substrate, and the portion of the first segment and the portion of the second segment of the second truck electrode form the first raised structure.

6. The active device array substrate of claim 4, wherein the first raised pattern is disposed between the whole second truck electrode and the substrate, and the whole second truck electrode forms the first raised structure.

7. The active device array substrate of claim 3, wherein the first raised pattern is disposed between the whole first segment and the substrate, and the whole first segment forms the first raised structure.

8. The active device array substrate of claim 7, wherein the first raised pattern is disposed between the whole second truck electrode and the substrate, and the whole second truck electrode forms the first raised structure.

9. The active device array substrate of claim 3, wherein the second truck electrode is divided into a first segment and a second segment by the first truck electrode, the first raised pattern is disposed between at least a portion of the first segment of the second truck electrode and the substrate and between at least a portion of the second segment of the second truck electrode and the substrate, and the portion of the first segment and the portion of the second segment of the second truck electrode form the first raised structure.

10. The active device array substrate of claim 1, wherein the first pixel electrode comprises:
    at least one third truck electrode, intersecting with the first truck electrode to form a second node at an intersection of the first truck electrode and the third truck electrode, wherein the second truck electrode and the third truck electrode are parallel to each other and close to the two adjoining data lines respectively; and
    a plurality of second branch electrodes, connected to the first truck electrode and the third truck electrode to define a plurality of second domains, wherein the second domains disposing on two opposite sides of the third truck electrode have different areas;
    the active device array substrate further comprising:
    at least one second raised pattern, at least disposed between the second node and the substrate to form a second raised structure at least at the second node.

11. The active device array substrate of claim 10, wherein the first truck electrode is divided into a first segment and a second segment by the third truck electrode, a length of the second segment is longer than a length of the first segment, the second raised pattern is disposed between the first segment and the substrate, and the first segment forms the second raised structure.

12. The active device array substrate of claim 11, wherein the second raised pattern is disposed between at least a portion of the second segment and the substrate, and the portion of the second segment forms the second raised structure.

13. The active device array substrate of claim 12, wherein the third truck electrode is divided into a first segment and a second segment by the first truck electrode, the second raised pattern is disposed between at least a portion of the first segment of the third truck electrode and the substrate and between at least a portion of the second segment of the third truck electrode and the substrate, and the portion of the first segment and the portion of the second segment of the third truck electrode form the second raised structure.

14. The active device array substrate of claim 12, wherein the second raised pattern is disposed between the whole third truck electrode and the substrate, and the whole third truck electrode forms the second raised structure.

15. The active device array substrate of claim 11, wherein the second raised pattern is disposed between the whole first segment and the substrate, and the whole first segment forms the second raised structure.

16. The active device array substrate of claim 15, wherein the second raised pattern is disposed between the whole third truck electrode and the substrate, and the whole third truck electrode forms the second raised structure.

17. The active device array substrate of claim 11, wherein the third truck electrode is divided into a first segment and a second segment by the first truck electrode, the second raised pattern is disposed between at least a portion of the first segment of the third truck electrode and the substrate and between at least a portion of the second segment of the third truck electrode and the substrate, and the portion of the first segment and the portion of the second segment of the third truck electrode form the second raised structure.

18. The active device array substrate of claim 1, further comprising:
   at least one second pixel electrode, disposed on the substrate; and
   at least one keel electrode, electrically connected to the second pixel electrode and the active device, wherein a plurality of projections of the first branch electrodes of the first pixel electrode on the substrate are not overlapped with a projection of the keel electrode on the substrate.

19. The active device array substrate of claim 18, wherein the first truck electrode of the first pixel electrode crosses the keel electrode.

20. The active device array substrate of claim 18, wherein a shortest distance between the projections of the first branch electrodes and the projection of the keel electrode on the substrate is larger than about 2 micrometers.

21. The active device array substrate of claim 1, further comprising:
   at least one second pixel electrode, disposed on the substrate; and
   at least one keel electrode, electrically connected to the second pixel electrode and the active device, wherein the first truck electrode is separated into a first sub-portion and a second sub-portion at the location of the keel electrode, and a plurality of projections of the first sub-portion and the second sub-portion on the substrate are not overlapped with a projection of the keel electrode on the substrate.

22. The active device array substrate of claim 21, wherein the first pixel electrode comprises:
   at least one third truck electrode, intersecting with the second sub-portion of the first truck electrode, wherein the second truck electrode intersects with the first sub-portion of the first truck electrode;
   a plurality of second branch electrodes, connected to the second sub-portion of the first truck electrode and the third truck electrode, wherein the first branch electrodes are connected to the first sub-portion of the first truck electrode and the second truck electrode; and
   at least one bridge electrode, crossing the keel electrode and connected to at least one of the first branch electrodes and at least one of the second branch electrodes.

23. The active device array substrate of claim 22, wherein the second truck electrode and the third truck electrode of the first pixel electrode are parallel to each other and close to the two adjoining data lines respectively, and a plurality of projections of the second truck electrode and the third truck electrode on the substrate are not overlapped with a projection of the keel electrode on the substrate.

24. The active device array substrate of claim 21, wherein a shortest distance between the projections of the first sub-portion and the keel electrode on the substrate is larger than about 2 micrometers.

25. The active device array substrate of claim 24, wherein a shortest distance between the projections of the second sub-portion and the keel electrode on the substrate is larger than about 2 micrometers.

26. The active device array substrate of claim 1, wherein the first truck electrode is disposed on an edge of the first pixel electrode, the second truck electrode is disposed on an edge of the first pixel electrode, and first node is disposed at a corner of the first pixel electrode.

27. The active device array substrate of claim 1, wherein the first raised pattern is disposed between the whole first truck electrode and the substrate, and the whole first truck electrode forms the first raised structure.

28. The active device array substrate of claim 1, wherein a first top surface of the first truck electrode above the first raised pattern has a greater height than a height of a second top surface of the first truck electrode connected to the first top surface.

29. An active device array substrate comprising:
   a substrate;
   at least one scan line, disposed on or above the substrate;
   at least one data line, disposed on or above the substrate;
   at least one active device, electrically connecting to the scan line and the data line;
   at least one first pixel electrode, disposed on the substrate and electrically connected to the active device, wherein the first pixel electrode comprises:
      at least one first truck electrode;
      at least one second truck electrode, intersecting with the first truck electrode and connected to the active device to form a first node at an intersection of the first truck electrode and the second truck electrode; and
      a plurality of first branch electrodes, connected to the first truck electrode and the second truck electrode to define a plurality of first domains, wherein the plurality of first branch electrodes are asymmetrical with respect to the second truck electrode; and
   at least one first raised pattern, disposed at least between the first node and the substrate to form a first raised structure at least at the first node, wherein a first top surface of the first truck electrode above the first raised pattern has a greater height than a height of a second top surface of the first truck electrode connected to the first top surface.

30. The active device array substrate of claim 29, wherein the first domains disposing on two opposite sides of the second truck electrode have different areas.

31. The active device array substrate of claim 29, wherein the first truck electrode is divided into a first segment and a second segment by the second truck electrode, a length of the second segment is longer than a length of the first segment, the first raised pattern is disposed between the first segment and the substrate, and the first segment forms the first raised structure.

32. The active device array substrate of claim 31, wherein the first raised pattern is disposed between at least a portion of the second segment and the substrate, and the portion of the second segment forms the first raised structure.

33. The active device array substrate of claim 32, wherein the second truck electrode is divided into a first segment and a second segment by the first truck electrode, the first raised pattern is disposed between at least a portion of the first segment of the second truck electrode and the substrate and between at least a portion of the second segment of the second truck electrode and the substrate, and the portion of the first segment and the portion of the second segment of the second truck electrode form the first raised structure.

34. The active device array substrate of claim 32, wherein the first raised pattern is disposed between the whole second truck electrode and the substrate, and the whole second truck electrode forms the first raised structure.

35. The active device array substrate of claim 31, wherein the first raised pattern is disposed between the whole first segment and the substrate, and the whole first segment forms the first raised structure.

36. The active device array substrate of claim 35, wherein the first raised pattern is disposed between the whole second truck electrode and the substrate, and the whole second truck electrode forms the first raised structure.

37. The active device array substrate of claim 31, wherein the second truck electrode is divided into a first segment and a second segment by the first truck electrode, the first raised pattern is disposed between at least a portion of the first segment of the second truck electrode and the substrate and between at least a portion of the second segment of the second truck electrode and the substrate, and the portion of the first segment and the portion of the second segment of the second truck electrode form the first raised structure.

38. The active device array substrate of claim 29, wherein the first pixel electrode comprises:
at least one third truck electrode, intersecting with the first truck electrode to form a second node at an intersection of the first truck electrode and the third truck electrode, wherein the second truck electrode and the third truck electrode are parallel to each other and close to the two adjoining data lines respectively; and
a plurality of second branch electrodes, connected to the first truck electrode and the third truck electrode to define a plurality of second domains, wherein the second domains disposing on two opposite sides of the third truck electrode have different areas;
the active device array substrate further comprising:
at least one second raised pattern, at least disposed between the second node and the substrate to form a second raised structure at least at the second node.

39. The active device array substrate of claim 38, wherein a third top surface of the first truck electrode above the second raised pattern has a greater height than a height of a fourth top surface of the first truck electrode connected to the third top surface.

40. The active device array substrate of claim 38, wherein the first truck electrode is divided into a first segment and a second segment by the third truck electrode, a length of the second segment is longer than a length of the first segment, the second raised pattern is disposed between the first segment and the substrate, and the first segment forms a second raised structure.

41. The active device array substrate of claim 40, wherein the second raised pattern is disposed between at least a portion of the second segment and the substrate, and the portion of the second segment forms the second raised structure.

42. The active device array substrate of claim 41, wherein the third truck electrode is divided into a first segment and a second segment by the first truck electrode, the second raised pattern is disposed between at least a portion of the first segment of the third truck electrode and the substrate and between at least a portion of the second segment of the third truck electrode and the substrate, and the portion of the first segment and the portion of the second segment of the third truck electrode form the second raised structure.

43. The active device array substrate of claim 41, wherein the second raised pattern is disposed between the whole third truck electrode and the substrate, and the whole third truck electrode forms the second raised structure.

44. The active device array substrate of claim 40, wherein the second raised pattern is disposed between the whole first segment and the substrate, and the whole first segment forms the second raised structure.

45. The active device array substrate of claim 44, wherein the second raised pattern is disposed between the whole third truck electrode and the substrate, and the whole third truck electrode forms the second raised structure.

46. The active device array substrate of claim 40, wherein the third truck electrode is divided into a first segment and a second segment by the first truck electrode, the second raised pattern is disposed between at least a portion of the first segment of the third truck electrode and the substrate and between at least a portion of the second segment of the third truck electrode and the substrate, and the portion of the first segment and the portion of the second segment of the third truck electrode form the second raised structure.

47. The active device array substrate of claim 29, further comprising:
at least one second pixel electrode, disposed on the substrate; and
at least one keel electrode, electrically connected to the second pixel electrode and the active device, wherein a plurality of projections of the first branch electrodes of the first pixel electrode on the substrate are not overlapped with a projection of the keel electrode on the substrate.

48. The active device array substrate of claim 47, wherein the first truck electrode of the first pixel electrode crosses the keel electrode.

49. The active device array substrate of claim 47, wherein a shortest distance between the projections of the first branch electrodes and the projection of the keel electrode on the substrate is larger than about 2 micrometers.

50. The active device array substrate of claim 29, further comprising:
at least one second pixel electrode, disposed on the substrate; and
at least one keel electrode, electrically connected to the second pixel electrode and the active device, wherein the first truck electrode is separated into a first sub-portion and a second sub-portion at the location of the keel electrode, and a plurality of projections of the first sub-portion and the second sub-portion on the substrate are not overlapped with a projection of the keel electrode on the substrate.

51. The active device array substrate of claim 50, wherein the first pixel electrode comprises:
at least one third truck electrode, intersecting with the second sub-portion of the first truck electrode, wherein the second truck electrode intersects with the first sub-portion of the first truck electrode;
a plurality of second branch electrodes, connected to the second sub-portion of the first truck electrode and the third truck electrode, wherein the first branch electrodes are connected to the first sub-portion of the first truck electrode and the second truck electrode; and
at least one bridge electrode, crossing the keel electrode and connected to at least one of the first branch electrodes and at least one of the second branch electrodes.

52. The active device array substrate of claim 51, wherein the second truck electrode and the third truck electrode of the first pixel electrode are parallel to each other and close to the two adjoining data lines respectively, and a plurality of projections of the second truck electrode and the third truck electrode on the substrate are not overlapped with a projection of the keel electrode on the substrate.

53. The active device array substrate of claim 50, wherein a shortest distance between the projections of the first sub-portion and the keel electrode on the substrate is larger than about 2 micrometers.

54. The active device array substrate of claim 53, wherein a shortest distance between the projections of the second sub-portion and the keel electrode on the substrate is larger than about 2 micrometers.

55. The active device array substrate of claim 29, wherein the first truck electrode is disposed on an edge of the first pixel electrode, the second truck electrode is disposed on an edge of the first pixel electrode, and first node is disposed at a corner of the first pixel electrode.

56. The active device array substrate of claim 29, wherein the first raised pattern is disposed between the whole first truck electrode and the substrate, and the whole first truck electrode forms the first raised structure.

* * * * *